(12) United States Patent
Schreiber et al.

(10) Patent No.: US 9,891,271 B2
(45) Date of Patent: Feb. 13, 2018

(54) TECHNIQUES AND CIRCUITS FOR TESTING A VIRTUAL POWER SUPPLY AT AN INTEGRATED CIRCUIT DEVICE

(71) Applicant: Advanced Micro Devices, Inc., Sunnyvale, CA (US)

(72) Inventors: Russell Schreiber, Austin, TX (US); Joel Irby, Austin, TX (US); Sudha Thiruvengadam, Austin, TX (US); Carl Dietz, Columbia City, IN (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 1159 days.

(21) Appl. No.: 13/946,107

(22) Filed: Jul. 19, 2013

(65) Prior Publication Data

US 2015/0022218 A1    Jan. 22, 2015

(51) Int. Cl.
*G01R 31/04*    (2006.01)
*G01R 31/26*    (2014.01)
*G01R 31/28*    (2006.01)

(52) U.S. Cl.
CPC ................ *G01R 31/2884* (2013.01)

(58) Field of Classification Search
None
See application file for complete search history.

(56) References Cited

U.S. PATENT DOCUMENTS

| | | | |
|---|---|---|---|
| 2007/0044158 A1* | 2/2007 | Cruzado | H04L 9/065 726/27 |
| 2012/0038367 A1* | 2/2012 | Fefer | G01R 31/2853 324/538 |
| 2015/0016159 A1* | 1/2015 | Deboy | H02J 3/383 363/71 |

* cited by examiner

*Primary Examiner* — Farhana Hoque

(57) ABSTRACT

A power grid provides power to one or more modules of an integrated circuit device via a virtual power supply signal. A test module is configured to respond to assertion of a test signal so that, when the power grid is working properly and is not power gated, an output of the test module matches the virtual power supply. When the power grid is not working properly, the output of the test module is a fixed logic signal that does not vary based on the power gated state of the one or more modules.

15 Claims, 4 Drawing Sheets

TECHNIQUES AND CIRCUITS FOR TESTING A VIRTUAL POWER SUPPLY AT AN INTEGRATED CIRCUIT DEVICE

BACKGROUND

Field of the Disclosure

The present disclosure generally relates to integrated circuit devices and more particularly to testing virtual power supplies at an integrated circuit device.

Description of the Related Art

To facilitate power management, an integrated circuit device can group its modules into different power domains, whereby each power domain employs a power grid that transfers power from the external power supply to the modules of the power domain. To reduce power consumption, the integrated circuit can individually "gate" each power grid, whereby a transistor or other switch (referred to as a power gate) at the power grid can be selectively placed in an open position in response to defined system conditions. Opening the power gate interrupts the flow of current to the corresponding power grid, thereby reducing the power supplied to the modules of the power domain.

During formation of the integrated circuit device, process variations or other conditions can cause errors in the formation of a power grid, such that the power grid's power gate is permanently placed in a closed position, an open position, or a highly resistive position. Consequently, the power gate cannot be properly opened or closed in response to the defined system conditions. However, such errors can be difficult to detect during qualification of the integrated circuit device, or can require expensive or undesirable testing circuits. For example, operation of the power grid and its associated power gate can be tested by connecting an oscillator circuit to the virtual power supply (the power supplied by the power grid) and measuring the oscillator output, but the oscillator circuit takes up a large amount of device area and can cause current leakage when the virtual power supply is power gated. The virtual power supply can also be connected to an external pin of the integrated circuit device for measurement during testing, but this requires the addition of an expensive pin to the integrated circuit device package.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

FIGS. 1-4 illustrate techniques for testing a power grid of an integrated circuit device using a test module incorporated into the integrated circuit device. The power grid provides power to one or more modules of the integrated circuit device via a signal referred to as a "virtual power supply." The test module is configured to respond to assertion of a test signal so that, when the power grid and associated power gate is working properly and is not power gated, a digital output of the test module matches the virtual power supply. When the power grid or power gate is not working properly, the output of the test module is a fixed logic signal that does not vary based on the power gated state of the one or more modules. The test module is a relatively small circuit that does not consume a large amount of device area. Further, the output signal of the test module can be recorded at a register or other storage device that can be externally accessed via a standard device interface, such as a debug interface. Accordingly, the results of testing the power grid are easily accessible, allowing the integrated circuit device to be quickly and inexpensively qualified for operation.

Figure 1:
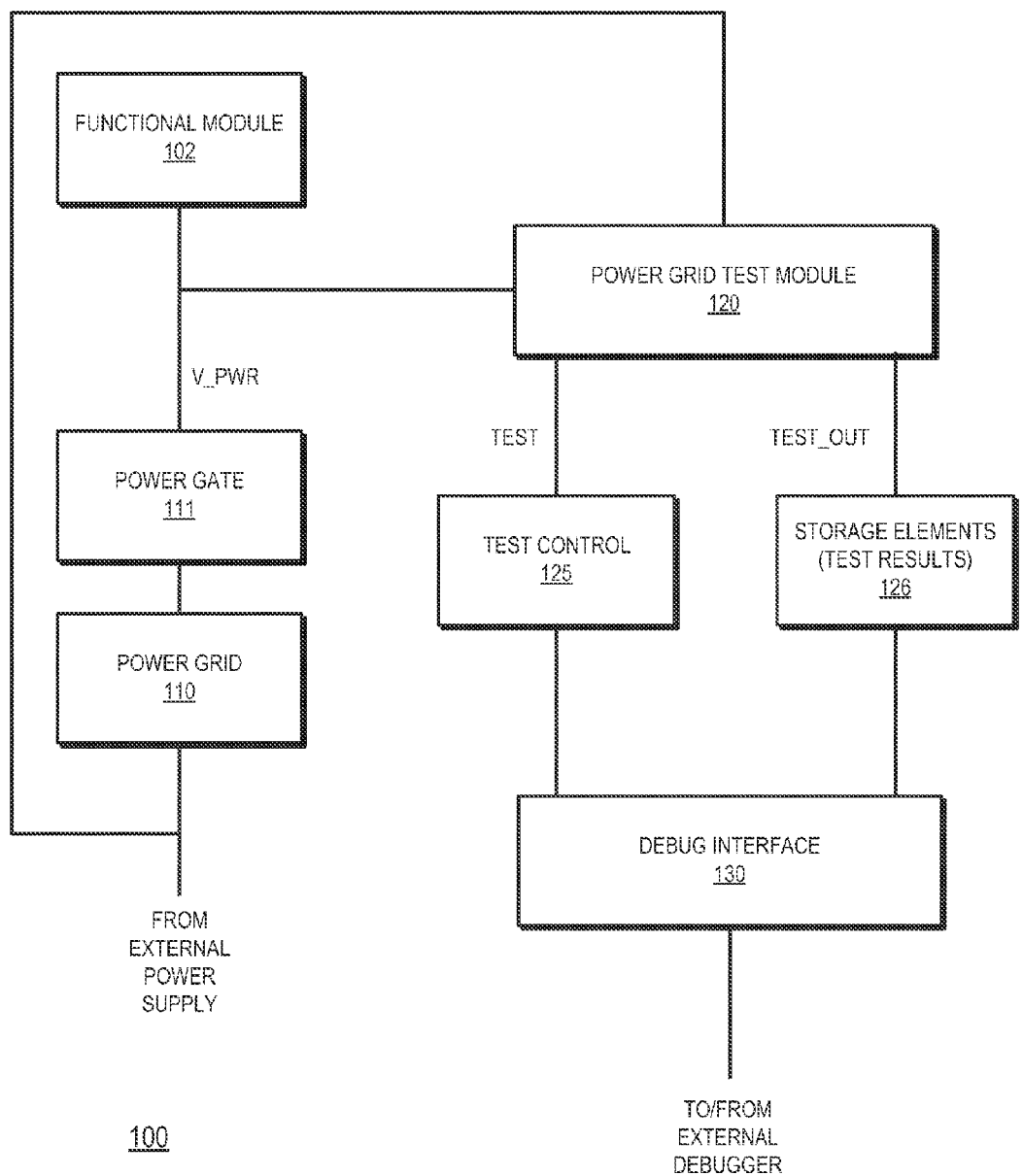
FIG. 1 is a block diagram of an integrated circuit device in accordance with some embodiments.

FIG. 1 illustrates an integrated circuit device 100 that employs a power grid test module 120 in accordance with some embodiments. The integrated circuit device 100 can be a processor having one or more processor cores, such as a central processing unit, a graphics processing unit, an accelerated processing unit, or a combination thereof. The integrated circuit device can also be a digital signal processor, a signal transceiver, an input/output controller, or any other device that employs modules of electronic circuits to execute defined operations. The integrated circuit device 100 can be implemented in any of a variety of electronic devices, such as a notebook computer, desktop computer, tablet computer, server, cellular phone, personal digital assistant (PDA), set-top box, game console, and the like.

In the depicted example, the integrated circuit device 100 includes a functional module 102 that performs one or more defined functions to allow the integrated circuit device 100 to execute its defined operations. Accordingly, the functional module 102 can be a processor core, northbridge, southbridge, memory controller, memory, input/output interface, network interface, network controller, and the like, or any portion thereof. In the illustrated example, power is supplied to the functional module 102 via a virtual power supply, designated "V_PWR". In some embodiments, the functional module 102 includes one or more circuits composed of transistors and other components disposed between two voltage rails. The V_PWR signal applies a voltage to one of the voltage rails with the other voltage rail tied to a different voltage reference (not shown), such as a ground voltage reference.

The integrated circuit device 100 generates the V_PWR signal using a power grid 110 and a power gate 111. The power grid 110 is connected to an external power supply (not shown) such as a battery, electrical outlet, fuel cell, solar cell, or other power source. The power provided by the external power supply may be conditioned by one or more circuits (not shown), such as an alternating current (AC) to direct current (DC) converter, DC-to-DC converter (e.g. a bang-buck or buck-buck converter), one or more filters to remove noise from the supplied power, one or more voltage regulators and the like. The circuits regulate the voltage supplied to the power grid 110 so that the voltage is set to a defined level within a defined tolerance. The power grid 110 includes one or more signal lines to distribute the power supplied by the external power supply to the power gate 111. The power grid 110 can also include other components, such as decoupling capacitors, to maintain the level and integrity of the power supplied to the power gate 111 within specified tolerances.

The power gate 111 is a transistor or other switch that can selectively couple the functional module 102 to the power grid 110, thereby controlling the level of the virtual power supply V_PWR. In particular, when the power gate 111 is in a closed state and the power grid 110 is functioning properly, the V_PWR signal will be set to a relatively high voltage level that is close to the voltage level provided by the external power supply. When the power gate 111 is placed in an open state, the V_PWR signal will be set to a relatively low voltage level. Placing the power gate 111 in the open state is referred to as "power gating" the functional module 102. In some embodiments, the integrated circuit device 100 employs power gating to control the level of power consumption by the functional module 102. For example, a power control module (not shown) of the integrated circuit device 100 can monitor device conditions, such as a level of expected activity at the functional module 102 and power gate the functional module 102 when the level of expected activity is sufficiently low. Thus, in some embodiments the functional module 102 is a processor core and the integrated circuit device 100 power gates the processor core when the level of expected processing activity at the processor core is below a threshold. When the level of expected activity at the functional module 102 rises above the threshold, the power control module can cease power gating by placing the power gate 111 in the closed state, such that power is again supplied via the virtual power supply V_PWR. In some embodiments, when the functional module is power gated, it enters a retention state, whereby data at storage modules (e.g. latches) of the functional module is retained, but the functional module does not perform operations to change the stored data.

Due to process variations or other errors during formation of the integrated circuit device 100, the power grid 110, the power gate 111, or a combination thereof can be malformed, such that the functional module 102 cannot be properly power gated. For example, the power gate 111 can be incorrectly formed such that it cannot be placed in a fully open state. Thus, even when the integrated circuit device 100 attempts to power gate the functional module 102, power is still supplied to the functional module 102 via the power gate 111. The power grid 110 can also be malformed such that it has an inherent resistance that is higher than a defined tolerance. This high resistance causes the virtual power supply signal V_PWR to have a voltage below a defined level even when the functional module 102 is not power gated, such that the functional module 102 cannot perform its operations properly. These failures in the power grid 110 and power gate 111 can be difficult to detect using conventional wafer sort tests. Accordingly, the integrated circuit device 100 employs a power grid test module 120 and a test control module 125 to test the operation of the power grid 110 and the power gate 111.

The test control module 125 is configured to generate a test control signal, labeled "TEST", in response to defined stimuli. In the depicted example of FIG. 1, the test control module 125 is controlled via a debug interface 130 that provides an external debugger (not shown) access to one or more debug functions of the integrated circuit device 100. In some embodiments, the debug interface 130 complies with the Institute of Electrical and Electronics Engineers (IEEE) 1149.1 Standard Test Access Port and Boundary-Scan Architecture, also referred to as the Joint Test Action Group (JTAG) standard. In some embodiments, the debug interface 130 complies with the IEEE 1687 standard, also referred to as the iJTAG standard. The debug interface 130 thereby allows testing of the power grid 110 and power gate 111, and the results thereof to be accessed, via a standard debug interface, rather than requiring the expensive allocation of a special device pin or custom interface. Thus, for example, to initiate a test of the power gate 111 and the power grid 110, control signaling can be sent from the external debugger to the test control module 125 via the debug interface 130, so that the signal TEST is asserted.

The power grid test module 120 is a circuit that, in response to assertion of the TEST signal, generates a signal labeled "TEST_OUT" that indicates whether the power gate 111 and power grid 110 are operating properly. In particular, the power grid test module 120 tests the state of the virtual power supply V_PWR. If the power grid 110 and power gate 111 are operating correctly, the power grid test module 120 is configured as a buffer, such that the TEST_OUT signal will match the logic state of the V_PWR signal. If the power grid 110 or power gate 111 are not operating properly (such as if the power gate 111 is stuck in an open state or the power grid 110 has been malformed to be highly resistive), the TEST_OUT signal will be fixed to a defined level (e.g. a negated logic level).

Thus, when the power gate 111 and power grid 110 are operating within defined parameters, the TEST_OUT signal will follow the V_PWR signal but, when they are not operating within the defined parameters, the TEST_OUT signal will be fixed. In some embodiments, the defined parameters are defined as a threshold level of V_PWR. That is, the TEST_OUT signal follows the state of the V_PWR signal when the V_PWR signal, in the asserted state, is above a threshold level and the TEST_OUT signal is fixed when the V_PWR signal, in the asserted state, is below the threshold level.

Accordingly, the operation of the power gate 111 and power grid 110 can be tested by measuring the state of the TEST_OUT signal over time, as the functional module 102 is first placed in an operational state and is then power gated. In the depicted example, the state of the TEST_OUT signal is recorded at storage elements 126. The storage elements 126 can be a register, a set of latches, a set of fuses, and the like, that are accessible by the external debugger via the debug interface 130.

In operation, the external debugger initiates a test of the functional module 102 by causing the test control module 125 to assert the TEST signal and by placing the power gate 111 in a closed state (such that the functional module 102 is not power gated). The external debugger then identifies the resulting value of the TEST_OUT signal, as indicated by the storage elements 126. The external debugger then causes the functional module 102 to be power gated, and again identifies the resulting value of the TEST_OUT signal. If the power gate 111 and power grid 110 are operating properly, the value of the TEST_OUT signal will change as the functional module is power gated, reflecting the change in the virtual power supply V_PWR. If either the power gate 111 or the power grid 110 is not operating properly, the signal TEST_OUT will remain at a fixed (e.g. negated) level. Accordingly, if the external debugger identifies that the level of the TEST_OUT signal does not change as a result of the functional module 102 being power gated, it indicates that the power gate 111 and power grid 110 are not operating properly. Remedial action can then be taken, such as further testing of the power gate 111 and the power grid 110, discarding of the integrated circuit device 100 prior to device packaging, or other remedial action.

Figure 2:
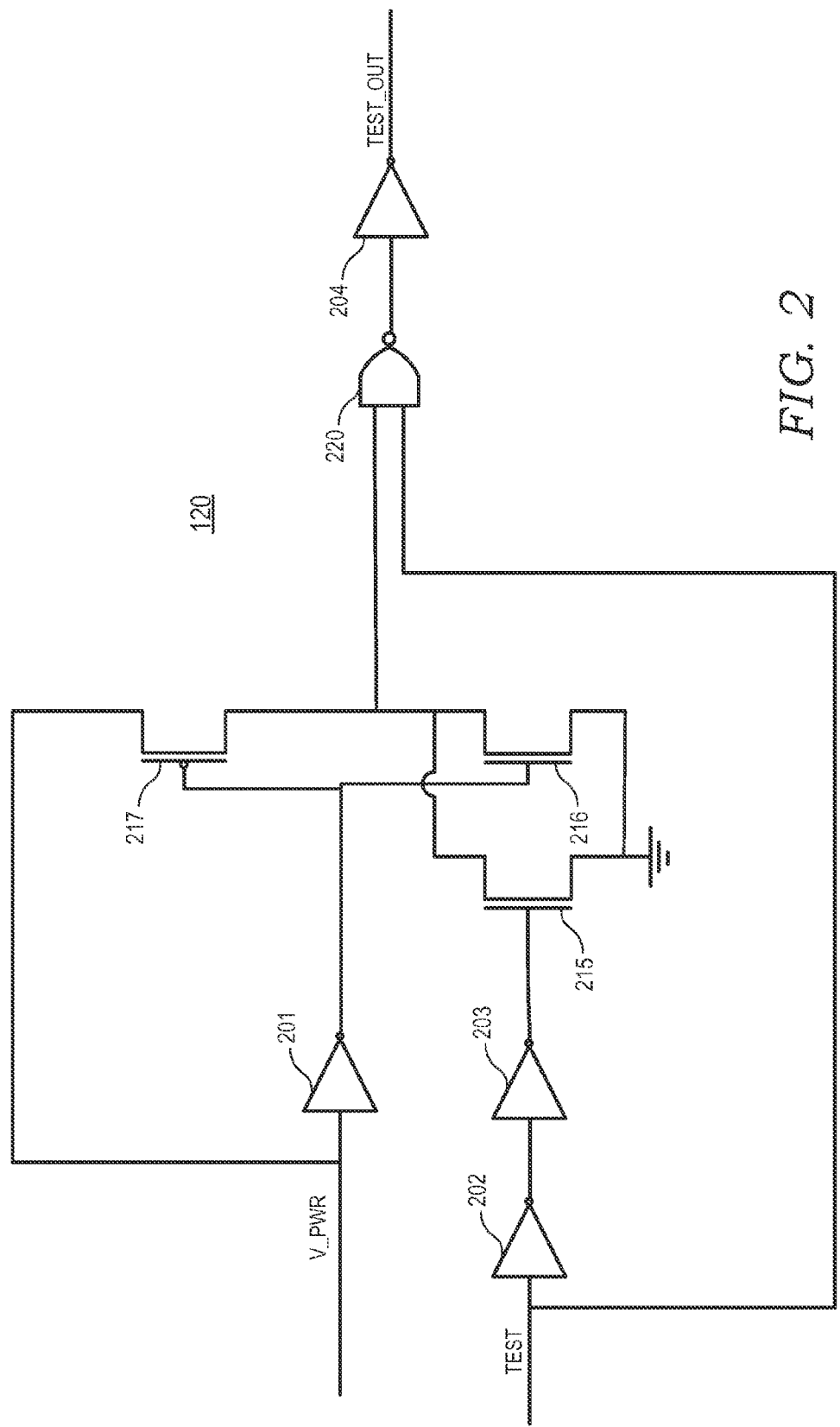
FIG. 2 is a circuit diagram of a power grid test module of FIG. 1 in accordance with some embodiments.

FIG. 2 illustrates a circuit diagram of the power grid test module 120 of FIG. 1 in accordance with some embodiments. The power grid test module 120 includes inverters 201, 202, 203, and 204, transistors 215, 216, and 217, and NAND gate 220. The inverter 201 includes an input to receive the signal V_PWR and an output. The inverter 202 includes an input to receive the signal TEST and an output. The inverter 203 includes an input connected to the output of the inverter 202 and an output. The transistor 217 includes a first current electrode connected to receive the signal V_PWR, a second current electrode, and a control electrode connected to the output of the inverter 201. The transistor 216 includes a first current electrode connected to the second current electrode of the transistor 217, a second current electrode connected to a ground voltage reference and a control electrode connected to the output of the inverter 201. The transistor 215 includes a first current electrode connected to the second current electrode of the transistor 217, a second current electrode connected to a ground voltage reference and a control electrode connected to the output of the inverter 203. The NAND gate includes an input connected to the second current electrode of the transistor 217, an input connected to receive the TEST signal, and an output. The inverter 204 includes an input connected to the output of the NAND gate 220 and an output to provide the TEST_OUT signal. Although not illustrated for clarity, the transistors of the inverters 201-204 and the NAND gate 220 are coupled between two voltage rails with a first of the voltage rails connected to receive the voltage supplied by the external power supply, and a second of the voltage rails coupled to the ground voltage reference. This ensures proper operation of the power grid test module 120 even if the power gate 111 and power grid 110 are not operating properly.

In operation, the transistors 217 and 216 are configured as an inverter. When the TEST signal is asserted, the transistor 215 is placed into a conductive state. The transistor 215 is sized to be sufficiently smaller than the transistors 216 and 217, such that, even when in the conductive state, it does not interfere with the operation of the inverter formed by the transistors 216 and 217 when the V_PWR signal is at a high level, but assists in pulling the output of the inverter to a negated level when the V_PWR signal is at a low level. Accordingly, when the V_PWR signal is at a high level, the TEST_OUT signal is set to an asserted state and, when the V_PWR signal is at a low level, the TEST_OUT signal is set to a negated state. In the absence of the transistor 215, the output of the inverter formed by the transistors 216 and 217 could enter an indeterminate state when the V_PWR signal is at a low level, such as when the functional module 102 is power gated. The transistor 215 thus ensures that the TEST_OUT signal properly reflects the state of the V_PWR signal when it is at a low level.

Because the TEST_OUT signal is based upon the V_PWR signal, it reflects whether the functional module is being properly power gated, as indicated by the following table:

| Operating Condition of Power Gate 110 and Power Gate 111 | TEST_OUT State When Functional Module 102 is Power Gated | TEST_OUT State When Functional Module 102 is Not Power Gated |
| --- | --- | --- |
| Operating properly | Negated | Asserted |
| Power Gate 110 Stuck Closed | Asserted | Asserted |
| Power Gate 111 Stuck Open or Power Grid 110 Highly Resistive | Negated | Negated |

Thus, when the power grid 110 and power gate 111 are operating properly the TEST_OUT signal changes state (e.g. from an asserted state to a negated state), as the power grid test module 120 is configured as a buffer for the signal V_PWR. In contrast, when either the power grid 110 or the power gate 111 are not operating properly, the TEST_OUT signal will be fixed in either a negated or asserted state, depending on the type of error at the power grid 110 and the power gate 111. Thus, by monitoring the state of the TEST_OUT signal and whether it changes as a result of power gating the functional module 102, errors in operation at the power grid 110 and power gate 111 can be detected.

Figure 3:
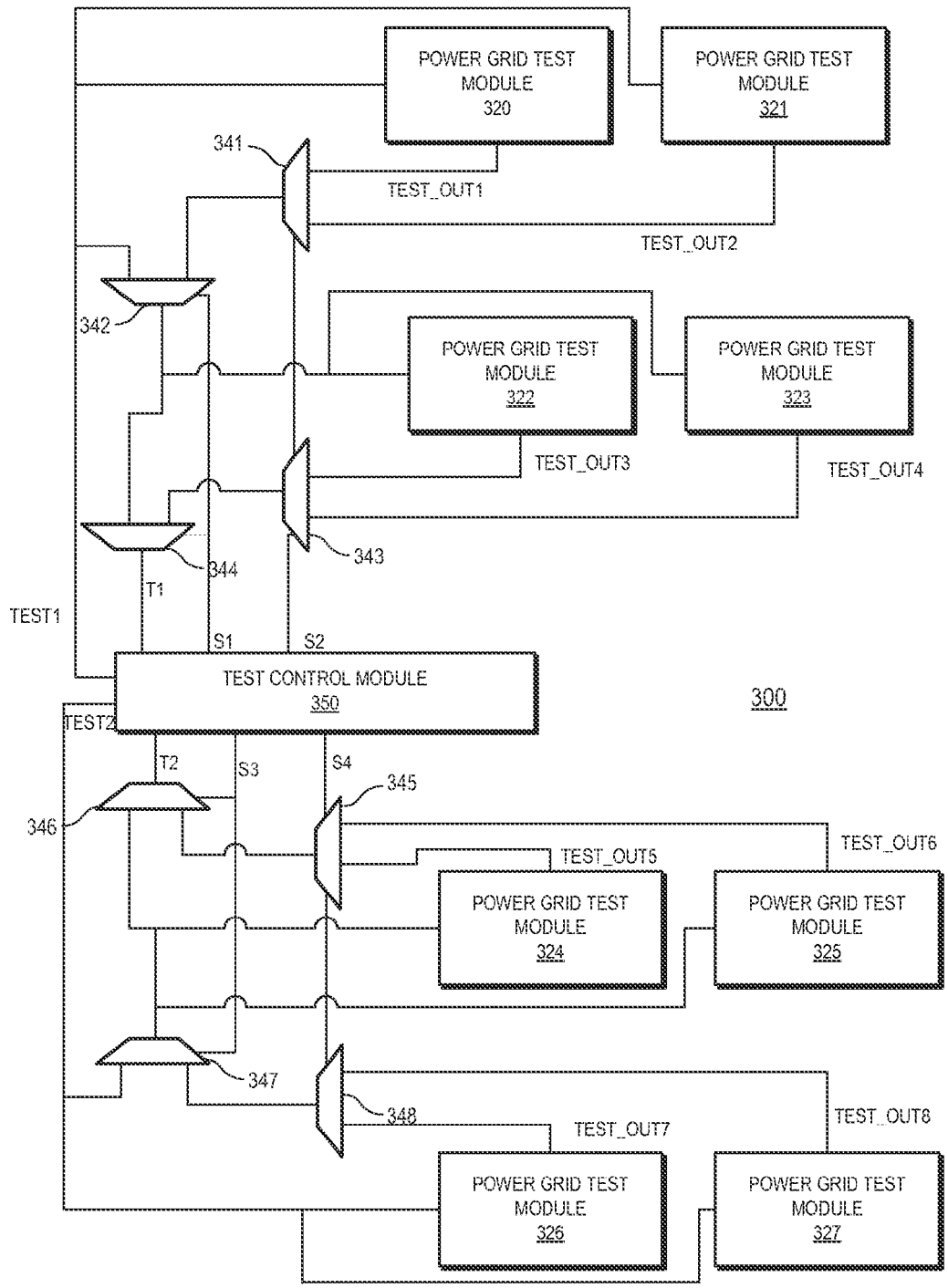
FIG. 3 is a block diagram of an integrated circuit device employing multiple instances of the power grid test module of FIG. 2 in accordance with some embodiments.

In some embodiments, an integrated circuit device can include multiple power grid test modules to individually test different power grids. An example is depicted at FIG. 3, which illustrates a block diagram of an integrated circuit device 300 including power grid test modules 320-327 in accordance with some embodiments. Each of the power grid test modules 320-327 is connected to receive a different virtual power supply signal generated by a different power grid and associated power gate, in similar fashion to the example of FIG. 1. The power grid test modules 320-327 are thus each connected to test the operation of a different power domain of the integrated circuit device 300.

The integrated circuit device 300 includes a test control module 350 and multiplexers 341-348. The test control module generates test enable signals, labeled TEST1 and TEST2 for groups of the power grid test modules 320-327. In particular, the power grid test modules 320-323 are connected to be enabled by the TEST1 signal and the power grid test modules 324-327 are connected to be enabled by the TEST2 signal. Each of the power grid test modules 320-328 is configured to generate a test output signal, labeled "TEST_OUT1" through "TEST_OUT8", respectively, based upon the functionality of their corresponding power grids and power gates, as explained with respect to FIGS. 1 and 2 above. The multiplexers 341-344 are connected to select, based on select signals labeled "S1" and "S2", one of the TEST_OUT1 through TEST_OUT4 signals for provision to the test control module 350 as a signal labeled T1 and the multiplexers 345-348 are connected to select, based on select signals labeled "S3" and "S4", one of the TEST_OUT1 through TEST_OUT4 signals for provision to the test control module 350 as a signal labeled T2.

In operation, the test control module 350 generates, based on control signaling received via the debug interface 130 (FIG. 1) the signals TEST1, TEST2, and S1 through S4 to test the power grids and power gates associated with the power grid test modules 320-327. Thus, for example, to test the power grid and power gate associated with the power grid test module 320, the test control module 350 asserts the TEST1 signal and sets the state of the S1 and S2 signals so that the TEST_OUT1 signal is selected for the T1 signal. The test control module 350 measures the state of the T1 signal as the functional module associated with the power grid test module 320 is power gated, and detects whether power gating changes the state of the T1 signal, as described above with respect to FIG. 2. If there is no change, the test control module 350 can indicate that the power grid and power gate associated with the power grid test module 320 are not operating correctly. The test control module 350 can then proceed to test the power grid and power gate associated with the power grid test module 321 by setting the S1 and S2 signals so that the TEST_OUT2 signal is selected for the T1 signal. In similar fashion, the test control module 350 can proceed to test all of the power domains for the integrated circuit device 300.

In some embodiments, at least some of the functionality described above may be implemented by one or more processors executing one or more software programs tangibly stored at a computer readable medium, and whereby the one or more software programs comprise instructions that, when executed, manipulate the one or more processors to perform one or more functions of the processing system described above. Further, in some embodiments, serial data interfaces described above are implemented with one or more integrated circuit (IC) devices (also referred to as integrated circuit chips). Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but are not limited to, optical media (e.g., compact disc (CD), digital versatile disc (DVD), or Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 4:
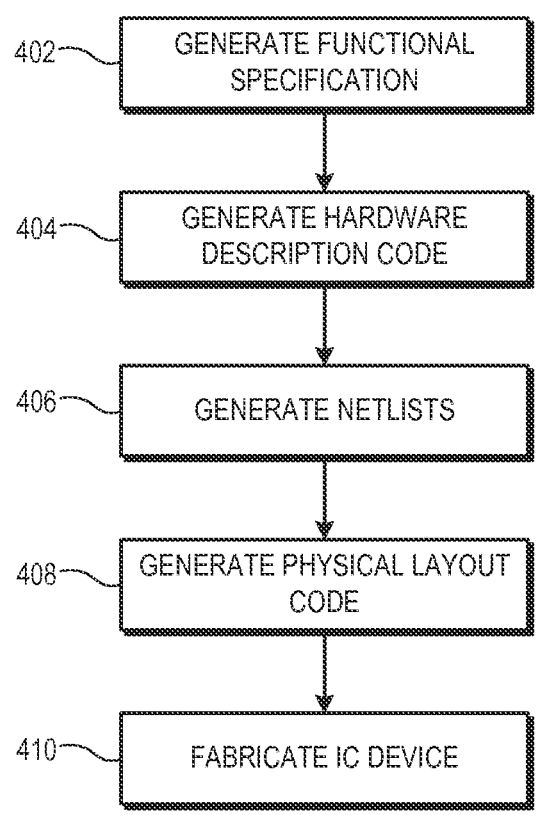
FIG. 4 is a flow diagram illustrating a method for designing and fabricating an integrated circuit device implementing at least a portion of a component of a processor in accordance with some embodiments.

FIG. 4 is a flow diagram illustrating an example method 400 for the design and fabrication of an IC device implementing one or more aspects in accordance with some embodiments. As noted above, the code generated for each of the following processes is stored or otherwise embodied in computer readable storage media for access and use by the corresponding design tool or fabrication tool.

At block 402 a functional specification for the IC device is generated. The functional specification (often referred to as a micro architecture specification (MAS)) may be represented by any of a variety of programming languages or modeling languages, including C, C++, SystemC, Simulink, or MATLAB.

At block 404, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 406 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 408, one or more EDA tools use the netlists produced at block 406 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 410, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

As disclosed herein, in some embodiments an integrated circuit device includes: a first power grid test module, comprising: a first input to receive a first power grid signal that supplies power to a first functional module; a second input to receive a test enable signal; and an output, wherein when the test enable signal is in an asserted state the first power grid test module is to provide a buffered representation of the first power grid signal at the output in response to the first power grid signal being within defined parameters and to provide a signal having a predefined state at the output in response to the first power grid signal being outside the defined parameters. In some aspects the integrated circuit device includes: a power grid to supply the first power grid signal; and wherein the first power grid signal being below the outside the defined parameters indicates the power grid is in an off state. In some aspects the integrated circuit device includes a power grid to supply the first power grid signal; and wherein the first power grid signal being below outside the defined parameters indicates the power grid is in a highly resistive state. In some aspects the first power grid test module further comprises: an inverter comprising: a first transistor comprising a first current electrode coupled to receive the first power grid signal, a second current electrode coupled to the output of the first power grid test module, and a control electrode to receive the first power grid signal; and a second transistor comprising a first current electrode coupled to the second current electrode of the first transistor, a second current electrode coupled to a voltage reference; and a control electrode to receive the first power grid signal; and a third transistor comprising a first current electrode coupled to the first current electrode of the second transistor, a second current electrode coupled to the voltage reference, and a control electrode to receive the test enable signal. In some aspects the first power grid test module further comprises: a NAND gate comprising a first input coupled to the second current electrode of the first transistor, a second input to receive the test first enable signal, and an output coupled to the output of the first power grid test module. In some aspects the integrated circuit device includes a storage element coupled to the output of the first power grid test module to record a state of a signal at the output in response to the test enable signal being asserted. In some aspects the integrated circuit device includes: a debug interface to provide an external indication of data recorded at the storage element. In some aspects the integrated circuit device includes: a second functional module; and a second power grid test module, comprising: a first input to receive a second power grid signal that supplies power to the first functional module; a second input to receive the test enable signal; and an output, wherein when the test enable signal is in an asserted state the second power grid test module is to provide a buffered representation of the second power grid signal at the output in response to the second power grid signal being within the defined parameters and to provide a negated signal at the output in response to the second power grid signal being outside the defined parameters. In some aspects the integrated circuit device includes: a first multiplexer comprising a first input coupled to the output of the first power grid test module, a second input coupled to the output of the second power grid test module, a control input to receive a first select signal, and an output. In some aspects the integrated circuit of claim 9 includes a third functional module; a third power grid test module, comprising: a first input to receive a third power grid signal that supplies power to the third functional module; a second input; and an output, wherein when a signal at the second input is in an asserted state the third power grid test module is to provide a buffered representation of the third power grid signal at the output in response to the second power grid signal being within the defined parameters and to provide a negated signal at the output in response to the second power grid signal being below outside the defined parameters; and a second multiplexer comprising a first input coupled to the output of the first multiplexer, a second input to receive the test enable signal, a control input to receive a second select signal, and an output.

In some embodiments, an integrated circuit device includes: a plurality of power domains; a plurality of power grids, each of the plurality of power grids to supply power to a corresponding one of the plurality of power domains via a power grid signal; and a plurality of power grid test modules, each of the power grid test modules comprising: a first input to receive a corresponding power grid signal from one of the plurality of power grids; a second input to receive a test enable signal; and an output, wherein when the test enable signal is in an asserted state the power grid test module is to provide a buffered representation of the power grid signal at the output in response to the power grid signal being within defined parameters and to provide a negated signal at the output in response to the power grid signal being outside the defined parameters. The integrated circuit device of claim 11, wherein each of the plurality of power grid test modules comprises: an inverter comprising: a first transistor comprising a first current electrode coupled to receive the power grid signal, a second current electrode coupled to the output of the power grid test module, and a control electrode to receive the corresponding power grid signal; and a second transistor comprising a first current electrode coupled to the second current electrode of the first transistor, a second current electrode coupled to a voltage reference; and a control electrode to receive the power grid signal; and a third transistor comprising a first current electrode coupled to the first current electrode of the second transistor, a second current electrode coupled to the voltage reference, and a control electrode to receive the test enable signal. In some aspects each of the plurality of power grid test modules further comprises: a NAND gate comprising a first input coupled to the second current electrode of the first transistor, a second input to receive the test enable signal, and an output coupled to the output of the power grid test module. In some aspects the integrated circuit device includes: a plurality of storage elements coupled to the plurality of power grid test modules, each of the plurality of storage elements to record the state of a corresponding one of the output signals of the plurality of power grid test modules in response to the test enable signal being asserted. In some aspects the integrated circuit includes: a debug interface coupled to the plurality of storage elements to provide external signaling indicative of data stored at the debug interface.

In some embodiments, a method includes: applying a test enable signal to a first power grid test module of an integrated circuit device to test a first power grid signal that supplies power to a first functional module of the integrated circuit device; and in response to application of the test enable signal, buffering the first power grid signal at an output of the first power grid test module responsive to a first power grid of an integrated circuit being in a functional state. In some aspects the method includes: in response to application of the test enable signal, providing a negated signal at the output of the first power grid test module responsive to the first power grid being in a non-functional state. In some aspects the method includes: in response to application of the test enable signal, recording a state of the output of the first power grid test module at a storage element; and providing an indication of data stored at the storage element via a debug interface of the integrated circuit device. In some aspects, the method includes: applying the test enable signal to a second power grid test module of an integrated circuit device to test a second power grid signal that supplies power to a second functional module of the integrated circuit device; and in response to application of the test enable signal, providing a negated signal at an output of the second power grid test module responsive to a second power grid of the integrated circuit device being in a non-functional state. In some aspects the method includes: in response to application of the test enable signal, buffering the second power grid signal at the output of the second power grid test module responsive to the first power grid being in a functional state.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An integrated circuit device comprising:
   a first power grid test module, comprising:
      a first input to receive a first power grid signal that supplies power to a first functional module;
      a second input to receive a test enable signal; and
      an output, wherein when the test enable signal is in an asserted state the first power grid test module is to provide a buffered representation of the first power grid signal at the output in response to the first power grid signal being within defined parameters and to provide a signal having a predefined state at the output in response to the first power grid signal being outside the defined parameters.

2. The integrated circuit device of claim 1, further comprising:
   a power grid to supply the first power grid signal; and
   wherein the first power grid signal being below the outside the defined parameters indicates the power grid is in an off state.

3. The integrated circuit device of claim 1, further comprising:
   a power grid to supply the first power grid signal; and
   wherein the first power grid signal being below outside the defined parameters indicates the power grid is in a highly resistive state.

4. The integrated circuit device of claim 1, wherein the first power grid test module further comprises:
   an inverter comprising:
      a first transistor comprising a first current electrode coupled to receive the first power grid signal, a second current electrode coupled to the output of the first power grid test module, and a control electrode to receive the first power grid signal; and
      a second transistor comprising a first current electrode coupled to the second current electrode of the first transistor, a second current electrode coupled to a voltage reference; and a control electrode to receive the first power grid signal; and
      a third transistor comprising a first current electrode coupled to the first current electrode of the second transistor, a second current electrode coupled to the voltage reference, and a control electrode to receive the test enable signal.

5. The integrated circuit device of claim 4, wherein the first power grid test module further comprises:
   a NAND gate comprising a first input coupled to the second current electrode of the first transistor, a second input to receive the test enable signal, and an output coupled to the output of the first power grid test module.

6. The integrated circuit device of claim 1, further comprising:
   a storage element coupled to the output of the first power grid test module to record a state of a signal at the output in response to the test enable signal being asserted.

7. The integrated circuit device of claim 6, further comprising:
   a debug interface to provide an external indication of data recorded at the storage element.

8. The integrated circuit device of claim 1, further comprising:
   a second functional module; and
   a second power grid test module, comprising:
      a first input to receive a second power grid signal that supplies power to the first functional module;
      a second input to receive the test enable signal; and
      an output, wherein when the test enable signal is in an asserted state the second power grid test module is to provide a buffered representation of the second power grid signal at the output in response to the second power grid signal being within the defined parameters and to provide a negated signal at the output in response to the second power grid signal being outside the defined parameters.

9. The integrated circuit device of claim 8, further comprising:
   a first multiplexer comprising a first input coupled to the output of the first power grid test module, a second input coupled to the output of the second power grid test module, a control input to receive a first select signal, and an output.

10. The integrated circuit device of claim 9, further comprising:
    a third functional module;
    a third power grid test module, comprising:
       a first input to receive a third power grid signal that supplies power to the third functional module;
       a second input; and
       an output, wherein when a signal at the second input is in an asserted state the third power grid test module is to provide a buffered representation of the third power grid signal at the output in response to the second power grid signal being within the defined parameters and to provide a negated signal at the output in response to the second power grid signal being below outside the defined parameters; and
    a second multiplexer comprising a first input coupled to the output of the first multiplexer, a second input to receive the test enable signal, a control input to receive a second select signal, and an output.

11. A method, comprising:
generating, via a test control module, a test enable signal to test a power grid and corresponding power gate of an integrated circuit device;
applying the test enable signal to a power grid test module of integrated circuit device to test a power grid signal, generated by the power grid and corresponding power gate, that supplies power to a functional module of the integrated circuit device; and
in response to application of the test enable signal, outputting a buffered representation of the power grid signal from the power grid test module responsive to the power grid and corresponding power gate of the integrated circuit device operating properly.

12. The method of claim 11, further comprising:
in response to application of the test enable signal, setting an output signal of the power grid test module to one of a negated or asserted level, responsive to the power grid and corresponding power gate of the integrated circuit device not operating properly.

13. The method of claim 12, further comprising:
in response to application of the test enable signal, recording a state of the output signal of the power grid test module at a storage element; and
providing an indication of data stored at the storage element via a debug interface of the integrated circuit device.

14. The method of claim 11, further comprising:
power gating the functional module of the integrated circuit device to control a level of power consumption, by placing the corresponding power gate of the power grid in an open state in response to a level of expected processing activity at the functional module being below a threshold; and
in response to a level of expected processing activity being above the threshold, ending the power gating by placing the corresponding power gate of the power grid in a closed state.

15. The method of claim 14, wherein
in response to the power gating, the functional module enters a retention state to retain data of the functional module at storage module.

* * * * *